(12) United States Patent
Rosch

(10) Patent No.: US 10,535,590 B2
(45) Date of Patent: Jan. 14, 2020

(54) MULTI-LAYER SOLDER RESISTS FOR SEMICONDUCTOR DEVICE PACKAGE SURFACES AND METHODS OF ASSEMBLING SAME

(71) Applicant: Intel Corporation, Santa Clara, CA (US)

(72) Inventor: Jonathan L. Rosch, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/858,650

(22) Filed: Dec. 29, 2017

(65) Prior Publication Data

US 2019/0206774 A1 Jul. 4, 2019

(51) Int. Cl.
| | | |
|---|---|---|
| *H01L 23/498* | (2006.01) | |
| *H01L 23/00* | (2006.01) | |
| *H01L 21/48* | (2006.01) | |
| *H05K 3/00* | (2006.01) | |
| *H05K 1/14* | (2006.01) | |
| *H05K 1/02* | (2006.01) | |

(52) U.S. Cl.
CPC .... *H01L 23/49811* (2013.01); *H01L 21/4857* (2013.01); *H01L 24/17* (2013.01); *H01L 24/81* (2013.01); *H05K 1/0298* (2013.01); *H05K 1/144* (2013.01); *H05K 3/0026* (2013.01); *H01L 2224/16227* (2013.01); *H05K 2203/0574* (2013.01)

(58) Field of Classification Search
CPC ..... H01L 2224/022–02215; H01L 2224/0391; H01L 2224/03916; H01L 2224/1148; H01L 2224/1191; H01L 2224/11916; H01L 2224/2748; H01L 2224/2791
See application file for complete search history.

(56) References Cited

U.S. PATENT DOCUMENTS

| | | | |
|---|---|---|---|
| 10,020,373 B1 * | 7/2018 | Kumakura | ............ H01L 29/872 |
| 2012/0211845 A1 * | 8/2012 | Daamen | .............. B81C 1/00246 |
| | | | 257/414 |

* cited by examiner

*Primary Examiner* — Thanh Y. Tran
(74) *Attorney, Agent, or Firm* — Schwegman Lundberg & Woessner, P.A.

(57) ABSTRACT

A multi-layer solder-resist provides useful adhesion to a semiconductor device package substrate while allowing for increasingly small geometries of bond pads and spacings.

21 Claims, 6 Drawing Sheets

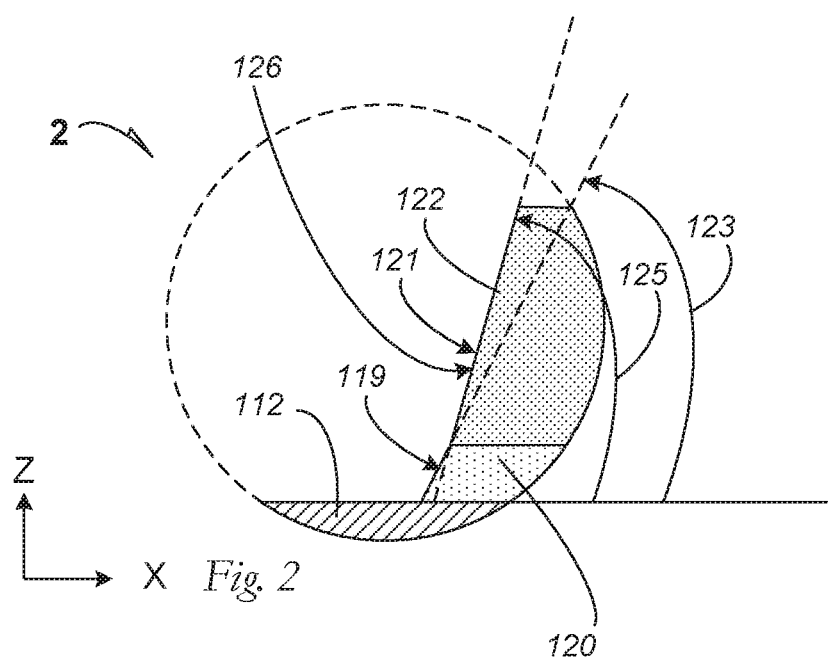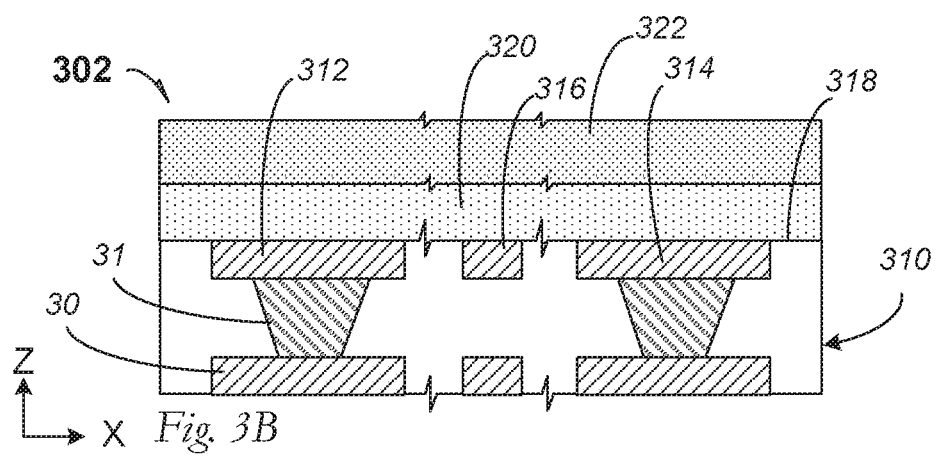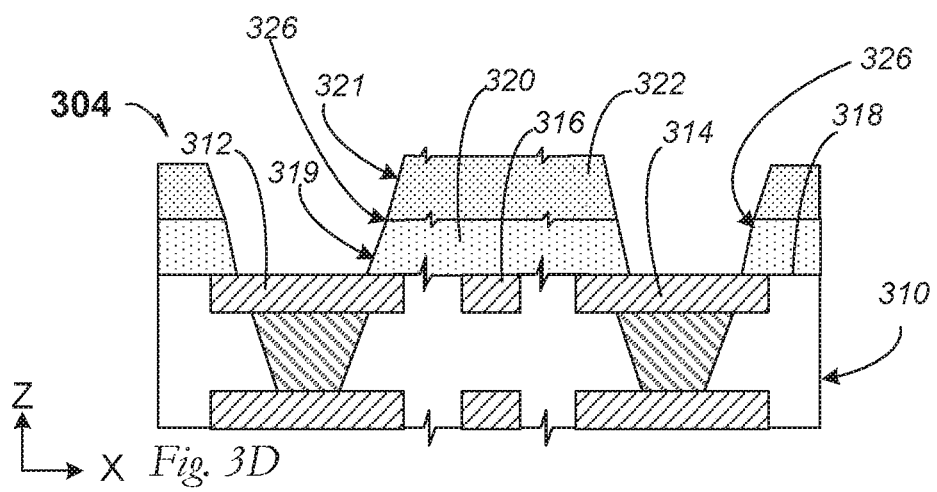

MULTI-LAYER SOLDER RESISTS FOR SEMICONDUCTOR DEVICE PACKAGE SURFACES AND METHODS OF ASSEMBLING SAME

FIELD

This disclosure relates to multi-layer solder resists for semiconductor device packages.

BACKGROUND

Semiconductive device miniaturization during packaging includes challenges to allow close-pitch electrical bumps to be located on semiconductor device package surfaces.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 2 is a detail section taken from FIG. 1D according to an embodiment;

FIG. 3B is a cross-section elevation of a semiconductor device package substrate according to an embodiment. FIG. 3A is omitted;

FIG. 3D is a cross-section elevation of the semiconductor device substrate depicted in FIG. 3B after further processing according to an embodiment;

FIGS. 4A, 4B and 4C are omitted;

DETAILED DESCRIPTION

A semiconductor device package substrate is fabricated with a multi-layer solder resist. Embodiments are used in small bond-pad geometries, such as 5-micrometer ($10^{-6}$ meter, or μm) and 5 μm spacing between bond pads, and smaller as influenced by package-geometries progress. In selected embodiments, the bond pads are 5 μm-diameter, and spacing between 5 μm-diameter bond pads is greater than 5 μm, such as 7 μm to 12 μm.

In an embodiment, a bi-layer solder resist is assembled to a semiconductor device package substrate. The bi-layer solder resist includes a build-up layer that is disposed on the package top layer and bond pads, and a solder-resist layer that is formed on the build-up layer. The build-up layer has a useful adhesive quality that is higher than that of the solder-resist layer. In an embodiment, a multi-layer solder resist is assembled to a semiconductor device package substrate. One multi-layer solder resist embodiment includes a first build-up layer, a subsequent solder-resist layer, and a third layer between the first and subsequent layers, such as an anti-reflective coating. Similarly, the third up layer has a useful adhesive quality that is higher than the solder-resist layer.

Disclosed embodiments include creating a multi-layer surface dielectric that includes thin build-up materials that interface with the surface of the bond pad to provide useful adhesion. A subsequent solder resist layer is formed above a first solder-resist layer, which may be a non-photo imageable build-up layer. Overall adhesion between the build-up layer and the solder-resist layer is improved.

Figure 1A:
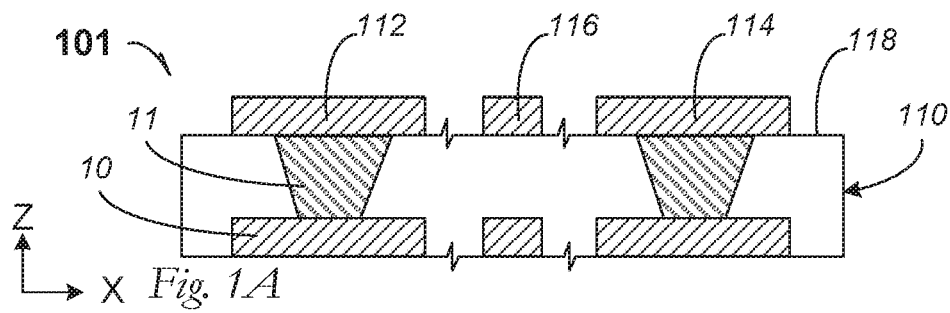
FIG. 1A is a cross-section elevation of a semiconductor device package substrate according to an embodiment.

FIG. 1A is a cross-section elevation of a semiconductor device package substrate 101 according to an embodiment. In an embodiment, a semiconductor device substrate 101 includes a top dielectric layer 110 and a first bond pad 112. Other structures and layers may be present, where the first bond pad 112, as illustrated along the Z-direction, is a top substrate contact pad 112 that is connected to a top via 11, which in turn is connected to a penultimate trace 10. The semiconductor device package substrate 101 is illustrated in simplified form where more trace and dielectric structures may appear in the negative-Z direction.

In an embodiment, the top dielectric layer 110 has more layers than the single layer displayed according to processing choices. In an embodiment, a subsequent bond pad 114 is disposed adjacent the first bond pad 112. In an embodiment, "adjacent" means there is no other bond pad between the first bond pad 112 and the subsequent bond pad 114, although an incidental trace 116 may be disposed between the first bond pad 112 and the subsequent bond pad 114. In and embodiment, the bond pads 112 and 114 as well as the trace 116, if present, are disposed on an upper surface 118 of the top dielectric layer 110. Consequently, the bond pads 112 and 114 as well as the trace 116 may be referred to a "surface copper" as the materials are made from copper in an embodiment. Similarly, the penultimate trace 10 may be referred to as surface—1 copper.

Figure 1B:
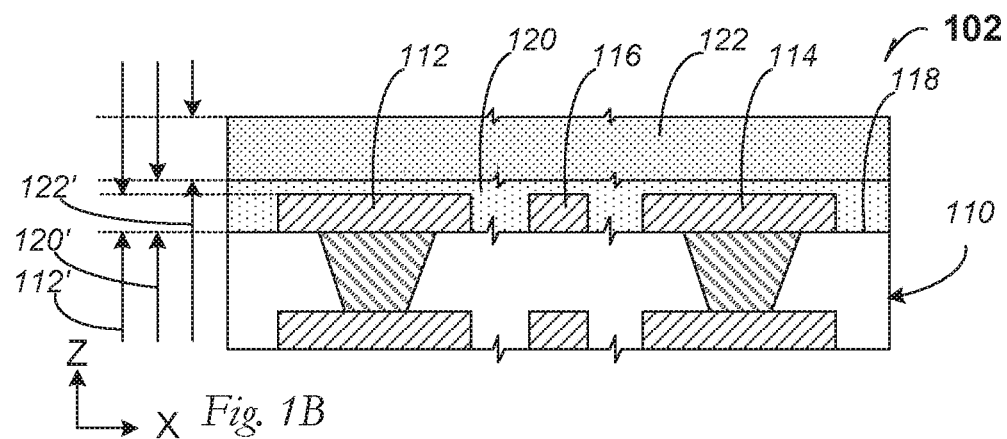
FIG. 1B is a cross-section elevation of the semiconductor device substrate depicted in FIG. 1A after further processing according to an embodiment.

FIG. 1B is a cross-section elevation of the semiconductor device substrate 101 depicted in FIG. 1A after further processing according to an embodiment. The semiconductor device substrate 102 has been processed by disposing a first solder-resist layer 120 on the upper surface 118 of the top dielectric layer 110 as well as in contact with the bond pads 112 and 114 and the trace 116. The first solder-resist layer 120 may also be referred to as a first build-up layer 120.

In an embodiment, the first solder-resist layer 120 contacts the first bond pad 112 as well as the top dielectric layer 110. In an embodiment, the first solder-resist layer 120 is photo-imageable. In an embodiment, the first bond pad 112 has a first bond-pad height 112' above the upper surface 118. In an embodiment, the first solder-resist layer 120 has a first solder-resist layer height 120' above the upper surface 118.

In an embodiment, a subsequent solder-resist layer 122 is disposed above the first solder-resist layer 120. In an embodiment, the subsequent solder-resist layer 122 is disposed above and on the first solder-resist layer 120. In an embodiment, the subsequent solder-resist layer 122 has a subsequent solder-resist layer height 122' above the first solder-resist layer 120. In this embodiment, with the first solder-resist layer 120 and the subsequent solder-resist layer 122 above and on the first solder-resist layer 120, a bi-layer solder resist is formed. In an embodiment, the subsequent solder-resist layer 122 is photo-imageable. As illustrated and in an embodiment, the first solder-resist layer height 120' is greater than the first bond-pad height 112'. In an embodiment, the subsequent solder-resist layer height 122' is greater than the first solder-resist layer height 120'.

In an embodiment, the first solder-resist layer 120 is liquid-applied, as a build-up layer 120, to the upper surface 118, followed by curing, and the subsequent solder-resist layer 122 is applied to the first solder-resist layer 120. In an embodiment, the first and subsequent solder-resist layers 120 and 122 are assembled as a composite sheet to the top dielectric layer 110. See FIG. 3 for an example application.

In an embodiment, the first solder-resist layer 120 exhibits a first adhesion strength and the subsequent solder-resist layer 122 exhibits a subsequent adhesion strength, and the first adhesion strength is greater than the subsequent adhesion strength. In an embodiment, "adhesion strength" is defined as the pulling force imposed upon a given solder-resist layer before it pulls free from a standard-setting layer such as the materials of the top dielectric layer 110.

In an embodiment, the first adhesion strength is in a range from 0.15 kilogram force (kgf) to 10 kgf and the subsequent adhesion strength is less than the first adhesion strength. In an embodiment, first adhesion strength is 1 kgf and the subsequent adhesion strength is less than the first adhesion strength. In an embodiment, first adhesion strength is 3 kgf and the subsequent adhesion strength is less than the first adhesion strength. In an embodiment, first adhesion strength is 5 kgf and the subsequent adhesion strength is less than the first adhesion strength. In an embodiment, first adhesion strength is 7 kgf and the subsequent adhesion strength is less than the first adhesion strength. In an embodiment, first adhesion strength is 9 kgf and the subsequent adhesion strength is less than the first adhesion strength.

In an embodiment, the first solder-resist layer 20 is build-up material such as GX-92 manufactured by Ajinomoto Fine-Techno Co. of Japan.

In an embodiment, the subsequent solder-resist layer 122 is a photo-imageable dielectric and SINR-DF manufactured by ShinEtsu of Japan.

The multi-layer solder-resist open (SRO) embodiments also provide useful adhesion to the top dielectric layer 110 such that processes like thermo-compression bonding is used without significant yield loss at the level of the bi-layer solder resist.

Figure 1C:
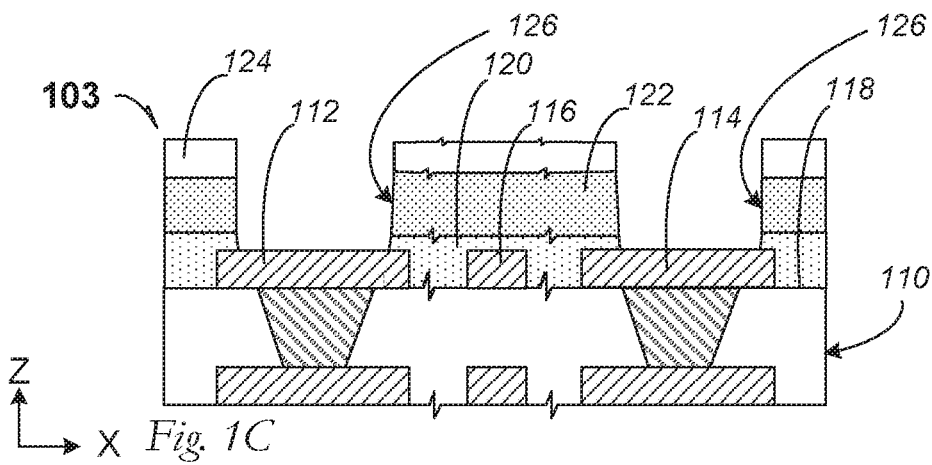
FIG. 1C is a cross-section elevation of the semiconductor device substrate depicted in FIG. 1B after further processing according to an embodiment.

FIG. 1C is a cross-section elevation of the semiconductor device substrate 102 depicted in FIG. 1B after further processing according to an embodiment. In an embodiment, the semiconductor device substrate 103 has been processed by patterning a mask 124 and opening a solder-resist open (SRO) 126 that exposes the first bond pad 112. In an embodiment, the SRO 126 is formed where the subsequent solder-resist layer 122 is photo-imageable, and the mask 124 is not needed, as the subsequent solder-resist layer 122 is used as an in situ mask that remains as part of the semiconductor device substrate 103.

As illustrated, the SRO 126 shows steep walls that is characteristic of photo imaging. In an embodiment, an SRO contour that is characteristic of photo imaging includes essentially right-angle walls with respect to the plane of the first bond pad 112. In an embodiment, residual etch chemistry products are detectible along the walls of the SRO, such as changed morphology of the SRO walls compared to morphology of either of the first solder-resist layer 120 or the subsequent solder-resist layer 122 at a location within an unetched bulk region of these respective layers 120 and 122.

In an embodiment where the subsequent solder-resist layer 122 is photo-imageable, a and after processing, the subsequent solder-resist layer 122 is characterizable as having post-photo imageable properties. In an embodiment, post-photo imageable properties may include the cured chemistry of the subsequent solder-resist layer 122. In an embodiment, post-photo imageable properties may include the etch steepness or contact angle of the of the subsequent solder-resist layer 122. For example, a post-photo imageable property may include an entrant or contact angle of the subsequent solder-resist layer 122 in a range between 85° and 90°, as through-mask directional etching achieves almost right contact angles.

Figure 1D:
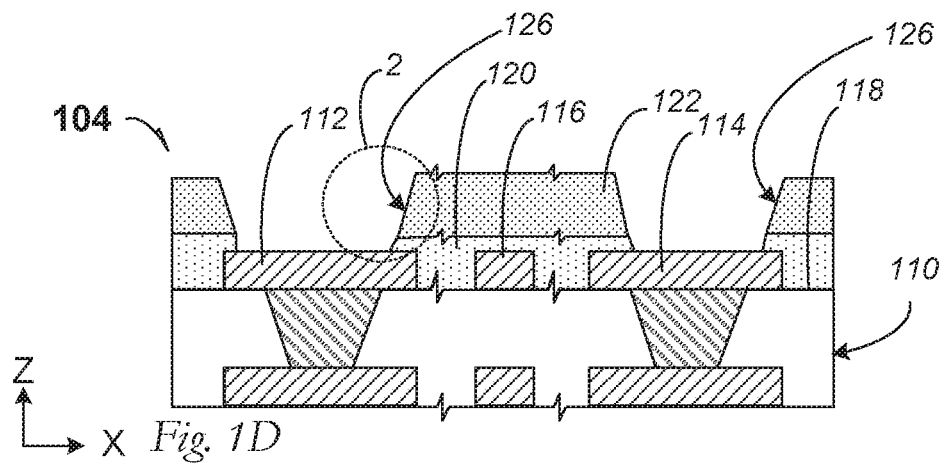
FIG. 1D is a cross-section elevation of the semiconductor device substrates depicted in either or both of FIGS. 1B and 1C, after further processing according to an embodiment.

FIG. 1D is a cross-section elevation of the semiconductor device substrates depicted in either or both of FIGS. 1B and 1C, after further processing according to an embodiment. In an embodiment, the semiconductor device substrate 102 depicted in FIG. 1B, is processed by forming the SRO 126 by a laser drill such as a $CO_2$ laser for creating the SRO 126.

Figure 1E:
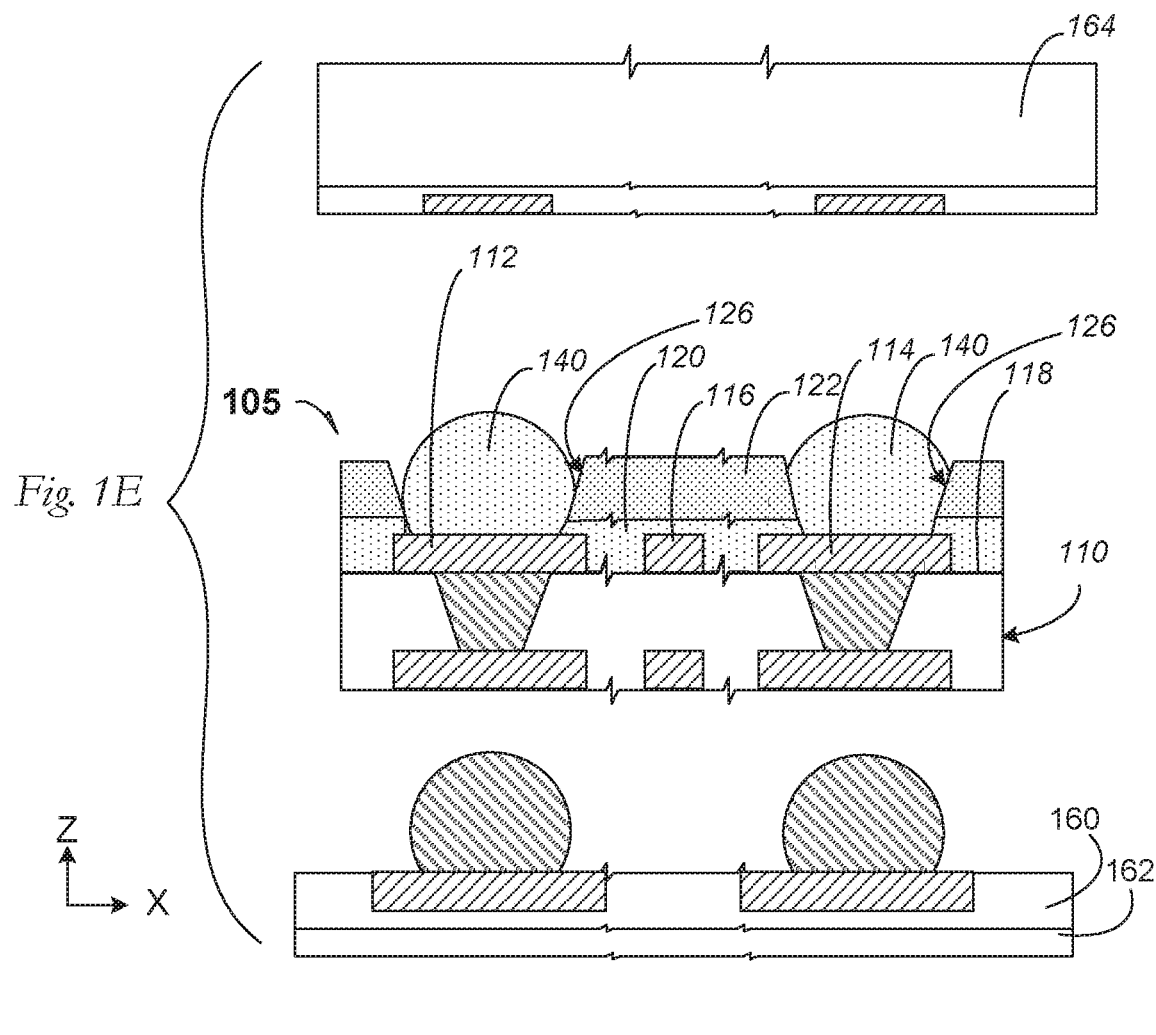
FIG. 1E is a cross-section elevation of the semiconductor device substrate depicted in FIG. 1D after further processing according to an embodiment.

FIG. 1E is a cross-section elevation of the semiconductor device substrate 104 depicted in FIG. 1D after further processing according to an embodiment. In an embodiment, the semiconductor device substrate 105 has been processed by forming a solder-paste bump 140 into the SROs 126 that contact the first and subsequent bond pads 112 and 114. The solder-paste bump 140 may be further processed by reflowing to create an electrical bump 140 in the SRO 126.

After forming the electrical bumps 140, the semiconductor device substrate 105 is seated on a board 160 such as a motherboard 160. In an embodiment, the board 160 includes an external shell 162 that provides both physical and electrical insulation for devices within the external shell 162. In an embodiment, a semiconductive device 164 such as a processor 164 is seated on the electrical bumps 140. In an embodiment, the semiconductive device 164 has a pad pitch that matches the 5/5 µm pitch spacing embodiment for the semiconductor device substrate 105.

FIG. 2 is a detail section 2 taken from FIG. 1D along the section-circle 2 according to an embodiment. The first bond pad 112 has been exposed by the SRO 126, which can be further defined with a first solder-resist open (SRO1) 119 through the first solder-resist layer 120. The SRO 126 can also be further defined with a subsequent solder-resist open (SROn$^{th}$) 121 in the subsequent solder-resist layer 122. The two SROs, SRO1 119 and STO$^{th}$ 121 expose the first bond pad 112.

Processing to form the SRO1 119 is accomplished by laser drilling in an embodiment. In an embodiment, ultraviolet (UV) laser drilling is used. In an embodiment, carbon dioxide ($CO_2$) laser drilling is used. Processing to form the SROn$^{th}$ 121 is accomplished by laser drilling in an embodiment. In an embodiment, ultraviolet (UV) laser drilling is used. In an embodiment, carbon dioxide ($CO_2$) laser drilling is used.

In an embodiment, the SRO1 119 exhibits a first contact angle 123 with respect to the plane of the first bond pad 112. In an embodiment, the SROn$^{th}$ 121 exhibits a subsequent contact angle 125 with respect to the plane of the first bond pad 112. As illustrated in an embodiment, the first contact angle 123 is different from the subsequent contact angle 125. In other Words, the SRO1 119 and the SROn$^{th}$ 121 collectively exhibit an SRO contour that is characteristic of laser drilling. Consequently, a first tapered contour 123 for the SRO1 119 and a subsequent tapered contour 125 for the SROn$^{th}$ 121 are formed by laser drilling, and the tapered first contour 123 is different front the subsequent tapered contour 125.

In art embodiment where the SRO 126 is formed by a laser-drilling process, the first contact angle 123 is flatter than the subsequent contact angle 125 as laser drilling tends to form a frusta-conical shaped SRO 126, and where the first- and subsequent layers 120 and 122 respond differently to laser drilling. In this embodiment, the contact angles 123 and 125 are flatter, such as between 50° and 85°, as through-mask directional etching achieves almost right contact angles. In an embodiment, the first contact angle 123 is 63° and the subsequent contact angle 125 is 72°.

In an embodiment where the SRO 126 is formed by a photo-patterning of the subsequent solder-resist layer 122 where the subsequent solder-resist layer 122 is photo-imageable. In this embodiment, the contact angles 123 and 125 are steeper, such as between 85° and 90°, as through-mask directional etching achieves almost right contact angles. In this embodiment where the subsequent solder-resist layer 122 is photo-imageable, the subsequent solder-resist layer 122 is used as an in situ mask that remains as part of the semiconductor device substrate 103.

In an embodiment as illustrated in FIG. 1C, the subsequent solder-resist layer 122 is not photo-imageable and patterning a mask 124 and opening the SRO 126 is carried out. In this embodiment, a directional etch through the mask 124 exposes the first bond pad 112.

FIG. 3B is a cross-section elevation of a semiconductor device package substrate 302 according to an embodiment. FIG. 3A is omitted.

In an embodiment, a semiconductor device substrate 301 includes a top dielectric layer 310 and a first bond pad 312. Other structures and layers may be present, where the first bond pad 312, as illustrated along the Z-direction, is a top substrate contact pad 112 that is connected to a top via 31, which in turn is connected to a penultimate trace 30. In an embodiment, the bond pads 312 and 314 as well as the trace 316, if present, are disposed embedded and coplanar to an upper surface 318 of the top dielectric layer 310.

In an embodiment, the top dielectric layer 310 has more layers than the single layer displayed according to processing choices. In an embodiment, the subsequent bond pad 314 is disposed adjacent the first bond pad 312. In an embodiment, "adjacent" means there is no other bond pad between the first bond pad 312 and the subsequent bond pad 314, although the incidental trace 316 may be disposed between the first bond pad 312 and the subsequent bond pad 314.

The semiconductor device substrate 302 has been processed by disposing a first solder-resist layer 320 on the upper surface 318 and on the first and subsequent bond pads 312 and 314, respectively, as well as on the top dielectric layer 110. In an embodiment, the first solder-resist layer 320 contacts the first bond pad 312 as well as the top dielectric layer 310. In an embodiment, the first solder-resist layer 320 is photo-imageable.

In an embodiment, a subsequent solder-resist layer 322 is disposed above the first solder-resist layer 320. In an embodiment, the subsequent solder-resist layer 322 is disposed above and on the first solder-resist layer 320. In an embodiment, the subsequent solder-resist layer 322 is photo-imageable.

In an embodiment, the first solder-resist layer 320 is liquid-applied to the upper surface 318 and the bond pads 312 and 314, followed by curing, and the subsequent solder-resist layer 322 is applied to the first solder-resist layer 320. In this embodiment, the first solder-resist layer 320 may be referred to as a first build-up layer 320. In an embodiment, the first and subsequent solder-resist layers 320 and 322 are assembled as a composite sheet to the top dielectric layer 310.

In an embodiment, the first solder-resist layer 320 exhibits a first adhesion strength and the subsequent solder-resist layer 322 exhibits a subsequent adhesion strength, and the first adhesion strength is greater than the subsequent adhesion strength.

In an embodiment, the first adhesion strength is in a range from 0.15 kilogram force (kgf) to 10 kgf and the subsequent adhesion strength is less than the first adhesion strength. In an embodiment, first adhesion strength is 1 kgf and the subsequent adhesion strength is less than the first adhesion strength. In an embodiment, first adhesion strength is 3 kgf and the subsequent adhesion strength is less than the first adhesion strength. In an embodiment, first adhesion strength is 5 kgf and the subsequent adhesion strength is less than the first adhesion strength. In an embodiment, first adhesion strength is 7 kgf and the subsequent adhesion strength is less than the first adhesion strength. In an embodiment, first adhesion strength is 9 kgf and the subsequent adhesion strength is less than the first adhesion strength.

FIG. 3D is a cross-section elevation of the semiconductor device substrate depicted in FIG. 3B after further processing according to an embodiment. FIG. 3C is omitted. In an embodiment, the semiconductor device substrate 304 has been processed by forming an SRO 326 by a laser drill such as a CO2 laser or an UV laser.

The first bond pad 312 has been exposed by the SRO 326, which can be further defined with a first solder-resist open (SRO1) 319 through the first solder-resist layer 320. The SRO 326 can also be further defined with a subsequent solder-resist open (SROn$^{th}$) 321 in the subsequent solder-resist layer 322. The two SROs, SRO1 319 and SRO$_n$$^{th}$ 321 expose the first bond pad 312.

In an embodiment, the SRO1 319 exhibits a first contact angle with respect to the plane of the first bond pad 312. In an embodiment, the SROn$^{th}$ 321 exhibits a subsequent contact angle with respect to the plane of the first bond pad 312. As illustrated in an embodiment, the first contact angle is different from the subsequent contact angle. In other words, the SRO1 319 and the SROn$^{th}$321 collectively exhibit an SRO contour that is characteristic of laser drilling. Consequently, a first tapered contour for the SRO1 319 and a subsequent tapered contour for the SROn$^{th}$ 321, and the tapered first contour is different from the subsequent tapered contour.

In an embodiment where the SRO 326 is formed by a laser-drilling process, the first contact angle is flatter than the subsequent contact angle as laser drilling tends to form a frusto-conical shaped SRO, and where the first- and subsequent layers 320 and 322 respond differently to laser drilling. In this embodiment, the contact angles are flatter, such as between 50° and 85°, as through-mask directional etching achieves almost right contact angles. In an embodiment, the first contact angle is 72° and the subsequent contact angle is 79°.

In an embodiment where the SRO 326 is formed by a photo-patterning of the subsequent solder-resist layer 322 where the subsequent solder-resist layer 322 is photo-imageable. In this embodiment, the contact angles are steeper, such as between 85° and 90°, as through-mask directional etching achieves almost right contact angles. In this embodiment where the subsequent solder-resist layer 322 is photo-imageable, the subsequent solder-resist layer 322 is used as an in situ mask that remains as part of the semiconductor device substrate 304.

Figure 4D:
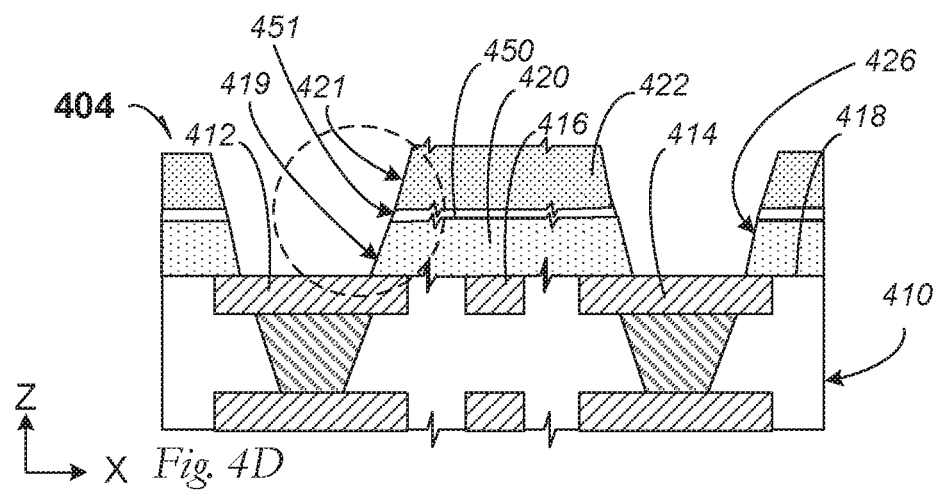
FIG. 4D is a cross-section elevation of a semiconductor device package substrate according to an embodiment.

FIG. 4D is a cross-section elevation of a semiconductor device package substrate 404 according to an embodiment. Processing of the semiconductor device package substrate 404 is done similarly to processing depicted in FIGS. 1A, 1B and 1D. FIGS. 4A, 4B and 4C are omitted. As illustrated, a third solder-resist layer 450 is disposed above and on a first solder-resist layer 420, and below and on a subsequent solder-resist layer 422. In an embodiment, the third solder-resist layer 450 is an antireflective coating (ARC, or anti-reflective coating) 450. Due to the thin and not necessarily opaque nature of the first build-up layer 420, the copper of the bond pads 412 and 414 can cause reflections through the first build-up layer 420 that hinder processing, the ARC 420 constricts reflections, whether the processing is laser drilling or mask patterning. In other words, the ARC 420 resists light transmissivity more than the subsequent solder-resist layer 422.

In an embodiment, the semiconductor device substrate 404 has been processed by forming an SRO 426 (illustrated exposing a subsequent bond pad 414) by a laser drill such as a CO2 laser. A first bond pad 412 has been exposed by an SRO, which is further defined with a first solder-resist open (SRO1) 419 through the first solder-resist layer 420, a third SRO3 451 through the third solder-resist layer 550, and a subsequent solder-resist open (SROn$^{th}$) 421 in the subsequent solder-resist layer 422. The several SROs, 419, 451 and 421 expose the first bond pad 412.

Processing to form the SROs 426 and collectively 419, 451 and 421, is accomplished by laser drilling in an embodiment. In an embodiment, ultraviolet (UV) laser drilling is used. In an embodiment, carbon dioxide ($CO_2$) laser drilling is used.

Figure 5:
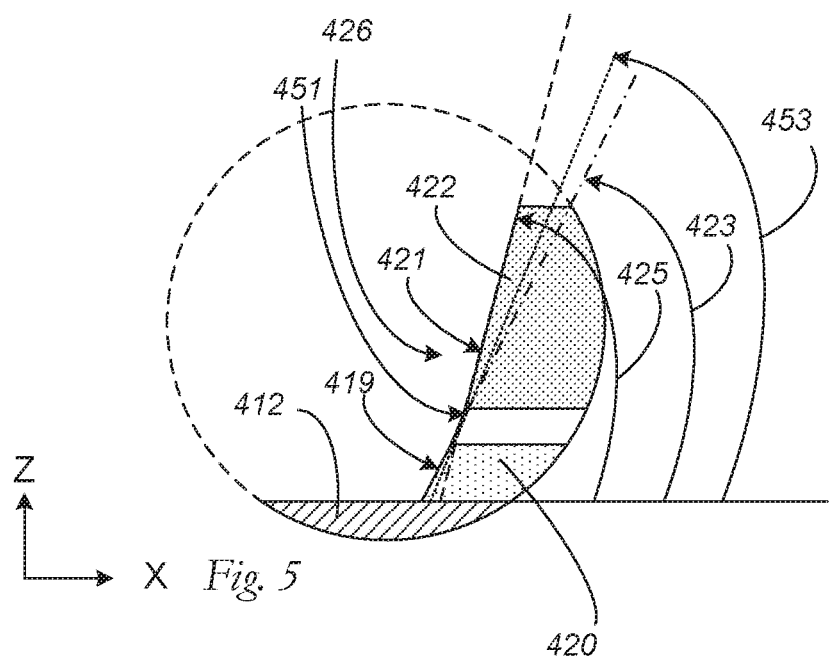
FIG. 5 is a detail section taken from FIG. 4D according to an embodiment.

FIG. 5 is a detail section taken from FIG. 4D according to an embodiment. The first bond pad 412 has been exposed by the SRO 426, which can be further defined with a first solder-resist open (SRO1) 419 through the first solder-resist layer 420. The SRO 426 can also be further defined with a subsequent solder-resist open (SRO$_n^{th}$) 421 in the subsequent solder-resist layer 422. The SRO 426 can be further defined with a third solder-resist open (SRO3$^{rd}$) 451 in the third layer 450. The three SROs, SRO1 419, SRO3 451 and SROn$^{th}$ 421 expose the first bond pad 412.

In an embodiment, the SRO1 419 exhibits a first contact angle with respect to the plane of the first bond pad 412. In an embodiment, the SRO3 451 exhibits a third contact angle 453 with respect to the plane of the first bond pad 412. In an embodiment, the SROn$^{th}$ 421 exhibits a subsequent contact angle 425 with respect to the plane of the first bond pad 412. In an embodiment, the first contact angle 423 is flatter than the third contact angle 453, and the third contact angle 453 is flatter than the subsequent contact angle 425. This progression of contact angles is characteristic of laser drilling processing.

In an embodiment where the SROs 426 and collectively 419, 451 and 421, is accomplished by is formed by a photo-patterning of the subsequent solder-resist layer 422 where the subsequent solder-resist layer 422 is photo-imageable.

Figure 6:
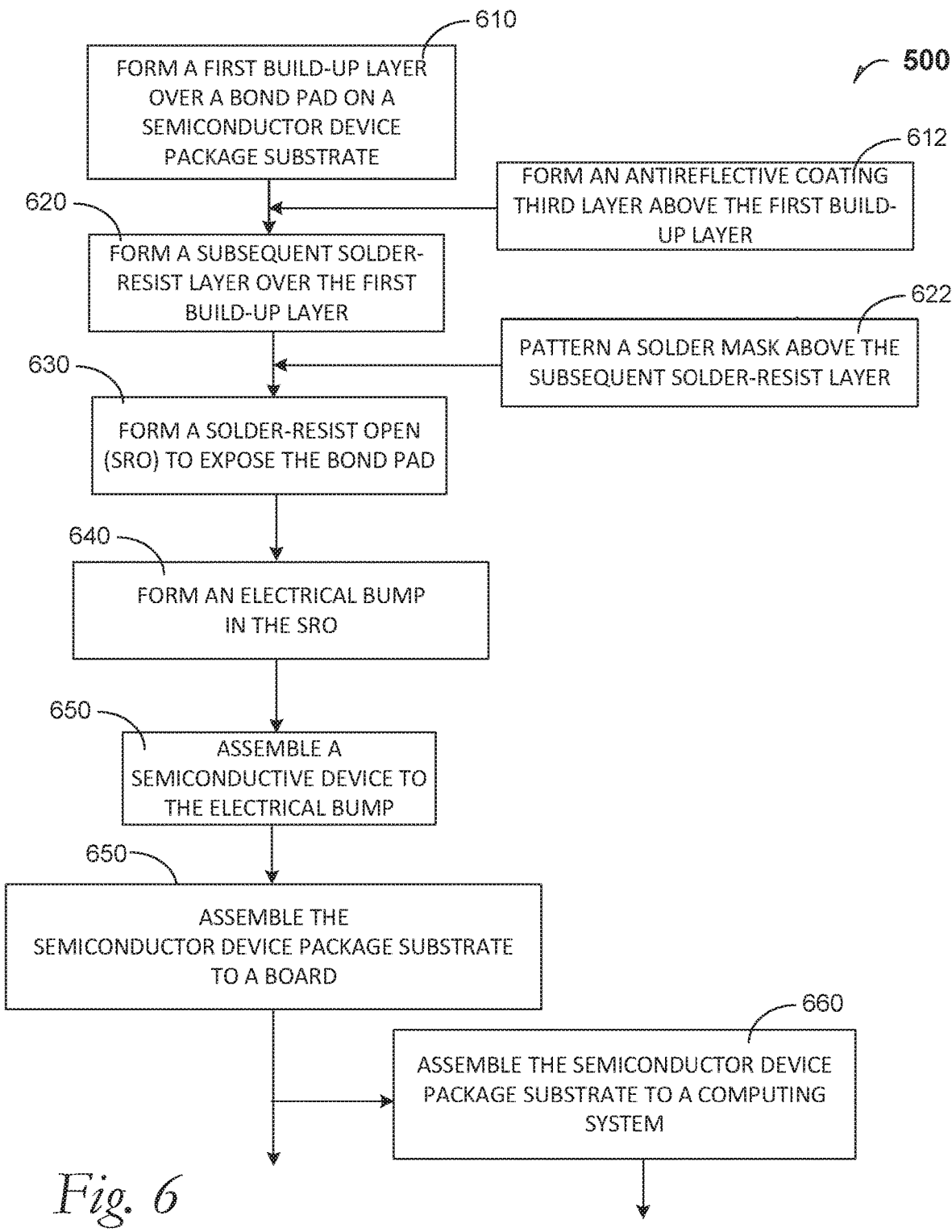
FIG. 6 is a process flow diagram according to an embodiment.

FIG. 6 is a process flow diagram 600 according to an embodiment.

At 610, the process includes forming a first build-up layer over a bond pad on a semiconductor device package substrate.

At 612, the process includes forming an antireflective coating third layer above and on the first build-up layer.

At 620, the process includes forming a subsequent solder-resist layer above the first build-up layer.

At 622, the process includes patterning a mask above the subsequent solder-resist layer.

At 630, the process includes forming a solder-resist open to expose the bond pad.

At 640, the process includes forming an electrical bump in the SRO.

At 650, the process includes assembling a semiconductive device to the electrical bump.

At 660, the process includes assembling the semiconductor package device substrate to a computing system.

Figure 7:
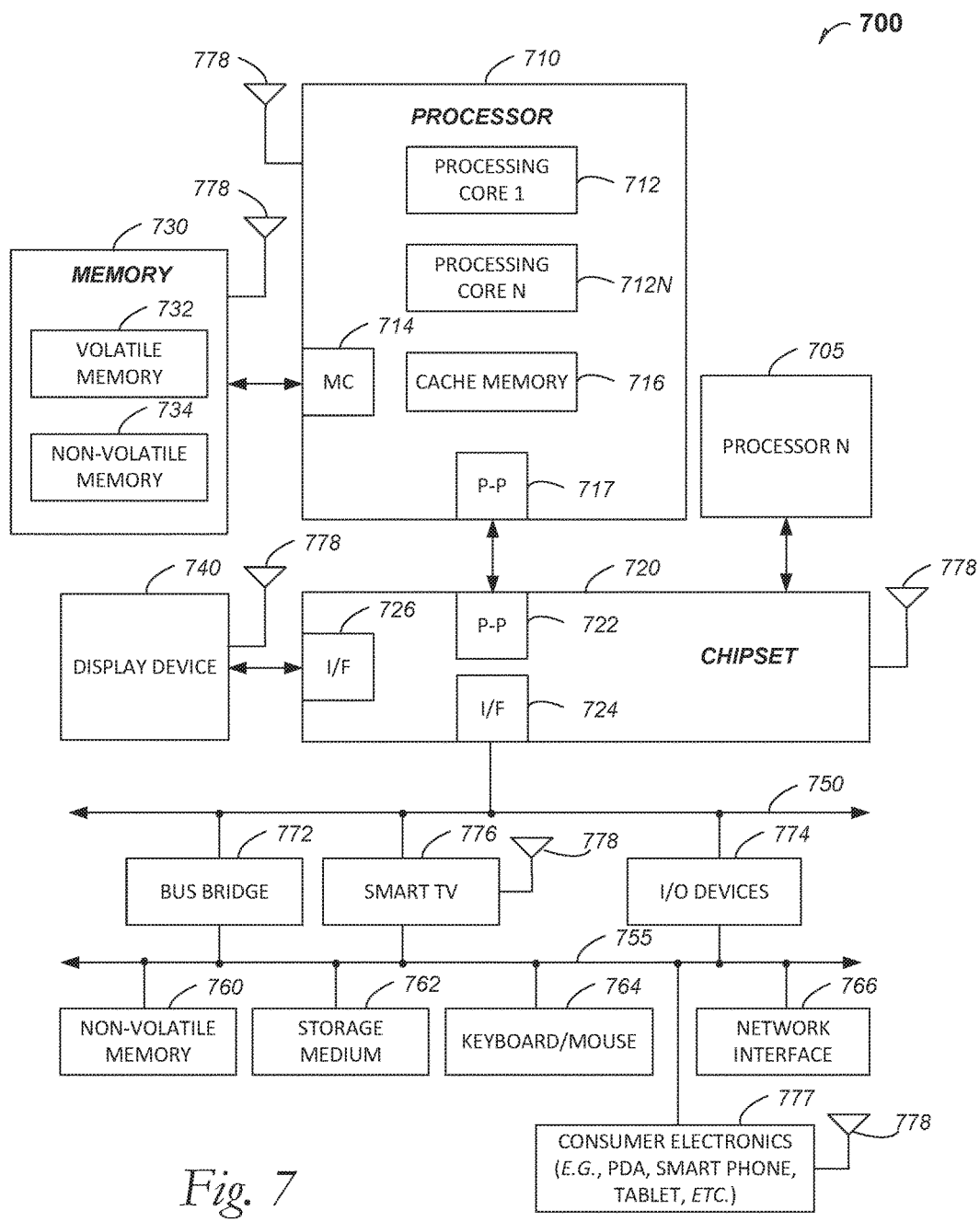
FIG. 7 is included to show an example of a higher-level device application for the disclosed embodiments.

FIG. 7 is included to show an example of a higher-level device application for the disclosed embodiments. The multi-layer solder resist on a semiconductor device package substrate embodiments may be found in several parts of a computing system. In an embodiment, the multi-layer solder resist on a semiconductor device package substrates part of a communications apparatus such as is affixed to a cellular communications tower. In an embodiment, a computing system 700 includes, but is not limited to, a desktop computer. In an embodiment, a system 700 includes, but is not limited to a laptop computer. In an embodiment, a system 700 includes, but is not limited to a netbook. In an embodiment, a system 700 includes, but is not limited to a tablet. In an embodiment, a system 700 includes, but is not limited to a notebook computer. In an embodiment, a system 700 includes, but is not limited to a personal digital assistant (PDA). In an embodiment, a system 700 includes, but is not limited to a server. In an embodiment, a system 700 includes, but is not limited to a workstation. In an embodiment, a system 700 includes, but is not limited to a cellular telephone. In an embodiment, a system 700 includes, but is not limited to a mobile computing device. In an embodiment, a system 700 includes, but is not limited to a smart phone. In an embodiment, a system 700 includes, but is not limited to an internet appliance. Other types of computing devices may be configured with the microelectronic device that includes multi-layer solder resist on a semiconductor device package substrate embodiments.

In an embodiment, the processor 710 has one or more processing cores 712 and 712N, where 712N represents the Nth processor core inside processor 710 where N is a positive integer. In an embodiment, the electronic device system 700 using a multi-layer solder resist on a semiconductor device package substrate embodiment that includes multiple processors including 710 and 705, where the processor 705 has logic similar or identical to the of the processor 710. In an embodiment, the processing core 712 includes, but is not limited to, pre-fetch logic to fetch instructions, decode logic to decode the instructions, execution logic to execute instructions and the like. In an embodiment, the processor 710 has a cache memory 716 to cache at least one of instructions and data for the multi-layer solder resist on a semiconductor device package substrate in the system 700. The cache memory 716 may be organized into a hierarchal structure including one or more levels of cache memory.

In an embodiment, the processor 710 includes a memory controller 714, which is operable to perform functions that enable the processor 710 to access and communicate with memory 730 that includes at least one of a volatile memory 732 and a non-volatile memory 734. In an embodiment, the processor 710 is coupled with memory 730 and chipset 720. In an embodiment, the chipset 720 is part of a system-inpackage with a multi-layer solder resist on a semiconductor device package substrate apparatus depicted in FIG. 1E. The processor 710 may also be coupled to a wireless antenna 778 to communicate with any device configured to at least one of transmit and receive wireless signals. In an embodiment, the wireless antenna interface 778 operates in accordance with, but is not limited to, the IEEE 802.11 standard and its related family, Home Plug AV (HPAV), Ultra Wide Band (UWE), Bluetooth, WiMax, or any form of wireless communication protocol.

In an embodiment, the volatile memory 732 includes, but is not limited to, Synchronous Dynamic Random Access Memory (SDRAM), Dynamic Random Access Memory (DRAM), RAMBUS Dynamic Random Access Memory (RDRAM), and/or my other type of random access memory device. The non-volatile memory 734 includes, but is not limited to, flash memory, phase change memory (PCM), read-only memory (ROM), electrically erasable programmable read-only memory (EEPROM), or any other type of non-volatile memory device.

The memory 730 stores information and instructions to be executed by the processor 710. In an embodiment, the memory 730 may also store temporary variables or other intermediate information while the processor 710 is executing instructions. In the illustrated embodiment, the chipset 720 connects with processor 710 via Point-to-Point (PtP or P-P) interfaces 717 and 722. Either of these PtP embodiments may be achieved using a multi-layer solder resist on a semiconductor device package substrate embodiment as set forth in this disclosure. The chipset 720 enables the processor 710 to connect to other elements in a multi-layer solder resist on a semiconductor device package substrate embodiment in a system 700. In an embodiment, interfaces 717 and 722 operate in accordance with a PtP communication protocol such as the Intel® QuickPath Interconnect (QPI) or the like. In other embodiments, a different interconnect may be used.

In an embodiment, the chipset 720 is operable to communicate with the processor 710, 705N, the display device 740, and other devices 772, 776, 774, 760, 762, 764, 766, 777, etc. The chipset 720 may also be coupled to a wireless antenna 778 to communicate with any device configured to at least do one of transmit and receive wireless signals.

The chipset 720 connects to the display device 740 via the interface 726. The display 740 may be, for example, a liquid crystal display (LCD), a plasma display, cathode ray tube (CRT) display, or any other form of visual display device. In an embodiment, the processor 710 and the chipset 720 are merged into a multi-layer solder resist on a semiconductor device package substrate in a system. Additionally, the chipset 720 connects to one or more buses 750 and 755 that interconnect various elements 774, 760, 762, 764, and 766. Buses 750 and 755 may be interconnected together via a bus bridge 772 such as at least one multi-layer solder resist on a semiconductor device package substrate on a semiconductor device package substrate apparatus embodiment. In an embodiment, the chipset 720, via interface 724, couples with a non-volatile memory 760, a mass storage device(s) 762, a keyboard/mouse 764, a network interface 766, smart TV 776, and the consumer electronics 777, etc.

In an embodiment, the mass storage device 762 includes, but is not limited to, a solid state drive, a hard disk drive, a universal serial bus flash memory drive, or any other form of computer data storage medium. In one embodiment, the network interface 766 is implemented by any type of well-known network interface standard including, but not limited to, an Ethernet interface, a universal serial bus (USB) interface, a Peripheral Component interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the multi-layer solder resist on a semiconductor device package substrate embodiment in a computing system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into the processor core 712.

Where useful, the computing system 700 may have a broadcasting structure interface such as for affixing the apparatus to a cellular tower.

To illustrate the multi-layer solder resist on a semiconductor device package substrate embodiments and methods disclosed herein, a non-limiting list of examples is provided herein:

Example 1 is a semiconductor device package, comprising: a first bond pad in contact with a top dielectric layer of a semiconductor device package substrate; a first solder-resist layer contacting the bond pad and the top dielectric layer, wherein the first solder-resist layer includes a first solder-resist open (SRO1) that exposes the bond pad; and a subsequent solder-resist layer disposed above the first solder-resist layer, wherein the subsequent solder-resist layer includes a subsequent solder-resist open (SROnth) that exposes the bond pad, and wherein the first solder-resist layer exhibits a first adhesion strength, the subsequent solder-resist layer exhibits a subsequent adhesion strength, and wherein the first adhesion strength is greater than the subsequent adhesion strength.

In Example 2, the subject matter of Example 1 optionally includes and a subsequent tapered contour for the SROnth, and wherein the first contour is different from the subsequent contour.

In Example 3, the subject matter of any one or more of Examples 1-2 optionally include wherein the subsequent solder-resist layer is disposed above and on the first solder-resist layer, wherein the first solder-resist layer has a first height, the subsequent solder-resist layer has a subsequent height, and wherein the subsequent height is greater than the first height.

In Example 4, the subject matter of any one or more of Examples 1-3 optionally include wherein the subsequent solder-resist layer is disposed above and on the first solder-resist layer, wherein the first solder-resist layer has a first height, the subsequent solder-resist layer has a subsequent height, wherein the subsequent height is greater than the first height, and wherein the subsequent solder-resist layer includes post-photo imageable properties.

In Example 5, the subject matter of any one or more of Examples 1-4 optionally include and a subsequent tapered contour for the SROnth, and wherein the first contour is different from the subsequent contour.

In Example 6, the subject matter of any one or more of Examples 1-5 optionally include a third solder-resist layer disposed above and on the first solder-resist layer, and below and on the subsequent solder-resist layer.

In Example 7, the subject matter of any one or more of Examples 1-6 optionally include a third solder-resist layer disposed above and on the first solder-resist layer, and below and on the subsequent solder-resist layer, and wherein the third solder-resist layer resists light transmissivity more than the subsequent solder-resist layer.

In Example 8, the subject matter of any one or more of Examples 1-7 optionally include wherein the first solder-resist layer exhibits a first adhesion strength, the subsequent solder-resist layer exhibits a subsequent adhesion strength, and wherein the first adhesion strength is greater than the subsequent adhesion strength.

In Example 9, the subject matter of any one or more of Examples 1-8 optionally include a first electrical bump disposed in the SRO1 that contacts the first bond pad, wherein the first electrical bump also contacts the first solder-resist layer and the subsequent solder resist layer; and a semiconductive device in contact with the first electrical bump.

In Example 10, the subject matter of any one or more of Examples 1-9 optionally include a first electrical bump disposed in the SRO1 that contacts the first bond pad, wherein the first electrical bump also contacts the first solder-resist layer and the subsequent solder resist layer; a semiconductive device in contact with the first electrical bump; and a board assembled to the semiconductor device package substrate opposite the electrical bump.

In Example 11, the subject matter of any one or more of Examples 1-10 optionally include wherein the first bond pad is recessed in the top dielectric layer.

Example 12 is a process of forming a semiconductor device package, comprising: forming a first solder-resist layer over a bond pad and in contact with an upper surface of a top dielectric layer of a semiconductor device package substrate; forming a subsequent solder-resist layer over the first solder-resist layer; and creating a solder-resist open (SRO) through the subsequent solder-resist layer and the first solder resist layer to expose the bond pad.

In Example 13, the subject matter of Example 12 optionally includes forming an antireflective coating third layer above and on the solder-resist first layer and below and on the subsequent solder-resist layer.

In Example 14, the subject matter of any one or more of Examples 12-13 optionally include wherein creating the SRO is accomplished by laser drilling through the subsequent solder-resist layer and the first solder resist layer to expose the bond pad.

In Example 15, the subject matter of any one or more of Examples 12-14 optionally include wherein creating the SRO is accomplished by: patterning the subsequent solder-resist layer by photoimaging the subsequent solder-resist layer; etching through the subsequent solder-resist layer and the first solder resist layer to expose the bond pad.

In Example 16, the subject matter of any one or more of Examples 12-15 optionally include wherein creating the SRO is accomplished by: patterning a mask above and on the subsequent solder-resist layer by photoimaging mask; etching through the subsequent solder-resist layer and the first solder resist layer to expose the bond pad.

In Example 17, the subject matter of any one or more of Examples 12-16 optionally include forming an antireflective coating third layer above and on the solder-resist first layer and below and on the subsequent solder-resist layer; patterning a mask above and on the subsequent solder-resist layer by photoimaging mask; etching through the subsequent solder-resist layer, the antireflective coating and the first solder resist layer to expose the bond pad.

In Example 18, the subject matter of any one or more of Examples 12-17 optionally include contacting the bond pad with an electrical bump; and assembling a semiconductive device to the electrical bump.

In Example 19, the subject matter of any one or more of Examples 12-18 optionally include contacting the bond pad with an electrical bump; assembling a semiconductive device to the electrical bump; and assembling the semiconductor device package substrate to a board.

Example 20 is a computing system, comprising: a semiconductive device; a first bond pad in contact with a top dielectric layer of a semiconductor device package substrate; a first solder-resist layer contacting the bond pad and the top dielectric layer, wherein the first solder-resist layer includes a first solder-resist open (SRO1) that exposes the bond pad; and a subsequent solder-resist layer disposed above the first solder-resist layer, wherein the subsequent solder-resist layer includes a subsequent solder-resist open (SROnth) that exposes the bond pad, and wherein the first solder-resist layer exhibits a first adhesion strength, the subsequent solder-resist layer exhibits a subsequent adhesion strength, and wherein the first adhesion strength is greater than the subsequent adhesion strength; an electrical bump disposed in the SRO that is in contact with the bond pad and electrically coupled to the semiconductive device; and a board assembled to the semiconductor device package substrate opposite the electrical bump, wherein the board includes an external shell.

In Example 21, the subject matter of Example 20 optionally includes wherein the semiconductive device is part of a chipset.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at, least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A semiconductor device package, comprising:
   a first bond pad in contact with a top dielectric layer of a semiconductor device package substrate;
   a first solder-resist layer contacting the bond pad and the top dielectric layer, wherein the first solder-resist layer includes a first solder-resist open (SRO1) that exposes the bond pad; and
   a subsequent solder-resist layer disposed above the first solder-resist layer, wherein the subsequent solder-resist layer includes a subsequent solder-resist open ($SROn^{th}$) that exposes the bond pad, and wherein the first solder-resist layer exhibits a first adhesion strength, the subsequent solder-resist layer exhibits a subsequent adhesion strength, and wherein the first adhesion strength is greater than the subsequent adhesion strength.

2. The semiconductor device package of claim 1, wherein the SRO1 and the $SROn^{th}$ exhibit an SRO contour that is characteristic of laser drilling, including a first tapered contour for the SRO1 and a subsequent tapered contour for the $SROn^{th}$, and wherein the first contour is different from the subsequent contour.

3. The semiconductor device package of claim 1, wherein the subsequent solder-resist layer is disposed above and on the first solder-resist layer, wherein the first solder-resist layer has a first height, the subsequent solder-resist layer has a subsequent height, and wherein the subsequent height is greater than the first height.

4. The semiconductor device package of claim 1, wherein the subsequent solder-resist layer is disposed above and on the first solder-resist layer, wherein the first solder-resist layer has a first height, the subsequent solder-resist layer has a subsequent height, wherein the subsequent height is greater than the first height, and wherein the subsequent solder-resist layer includes post-photo imageable properties.

5. The semiconductor device package of claim 1, wherein the SRO1 and the $SROn^{th}$ exhibit an SRO contour that is characteristic of photo imaging of the $SROn^{th}$ layer, including a first tapered contour for the SRO1 and a subsequent tapered contour for the $SROn^{th}$, and wherein the first contour is different from the subsequent contour.

6. The semiconductor device package of claim 1, further including a third solder-resist layer disposed above and on the first solder-resist layer, and below and on the subsequent solder-resist layer.

7. The semiconductor device package of claim 1, further including a third solder-resist layer disposed above and on the first solder-resist layer, and below and on the subsequent solder-resist layer, and wherein the third solder-resist layer resists light transmissivity more than the subsequent solder-resist layer.

8. The semiconductor device package of claim 1, further including a third solder-resist layer disposed above and on the first solder-resist layer, and below and on the subsequent solder-resist layer, and wherein the third solder-resist layer resists light transmissivity more than the subsequent solder-resist layer, wherein the SRO1 and the $SROn^{th}$ exhibit an SRO contour that is characteristic of photo imaging of the $SROn^{th}$ layer, including a first tapered contour for the SRO1 and a subsequent tapered contour for the $SROn^{th}$ and wherein the first contour exhibits a flatter contact angle from the subsequent contour.

9. The semiconductor device package of claim 1, further including:
   a first electrical bump disposed in the SRO1 that contacts the first bond pad, wherein the first electrical bump also contacts the first solder-resist layer and the subsequent solder resist layer; and
   a semiconductive device in contact with the first electrical bump.

10. The semiconductor device package of claim 1, further including:
    a first electrical bump disposed in the SRO1 that contacts the first bond pad, wherein the first electrical bump also contacts the first solder-resist layer and the subsequent solder resist layer;
    a semiconductive device in contact with the first electrical bump; and
    a board assembled to the semiconductor device package substrate opposite the electrical bump.

11. The semiconductor device package of claim 1, wherein the first bond pad is recessed in the top dielectric layer.

12. A computing system, comprising:
    a semiconductive device;
    a first bond pad in contact with a top dielectric layer of a semiconductor device package substrate;
    a first solder-resist layer contacting the bond pad and the top dielectric layer, wherein the first solder-resist layer includes a first solder-resist open (SRO1) that exposes the bond pad; and a subsequent solder-resist layer disposed above the first solder-resist layer, wherein the subsequent solder-resist layer includes a subsequent solder-resist open (SROn$^{th}$) that exposes the bond pad, and wherein the first solder-resist layer exhibits a first adhesion strength, the subsequent solder-resist layer exhibits a subsequent adhesion strength, and wherein the first adhesion strength is greater than the subsequent adhesion strength;

an electrical bump disposed in the SRO that is in contact with the bond pad and electrically coupled to the semiconductive device; and a board assembled to the semiconductor device package substrate opposite the electrical bump, wherein the board includes an external shell.

13. The computing system of claim 12, wherein the semiconductive device is part of a chipset.

14. A semiconductor device package, comprising:
a first bond pad in contact with a top dielectric layer of a semiconductor device package substrate;
a first solder-resist layer contacting the bond pad and the top dielectric layer, wherein the first solder-resist layer includes a first solder-resist open (SRO1) that exposes the bond pad;
a subsequent solder-resist layer disposed above the first solder-resist layer, wherein the subsequent solder-resist layer includes a subsequent solder-resist open (SROn$^{th}$) that exposes the bond pad, and wherein the first solder-resist layer exhibits a first adhesion strength, the subsequent solder-resist layer exhibits a subsequent adhesion strength, and wherein the first adhesion strength is greater than the subsequent adhesion strength;
a first tapered contour for the SRO1 and a subsequent tapered contour for the SROn$^{th}$, and wherein the first contour exhibits a flatter contact angle from the subsequent contour; and
a third solder-resist layer disposed above and on the first solder-resist layer, and below and on the subsequent solder-resist layer.

15. The semiconductor device package of claim 14, further including a first electrical bump disposed in the SRO1 that contacts the first bond pad, wherein the first electrical bump also contacts the first solder-resist layer and the subsequent solder resist layer.

16. The semiconductor device package of claim 14, wherein the third solder-resist layer resists light transmissivity more than the subsequent solder-resist layer.

17. The semiconductor device package of claim 14, wherein the third solder-resist layer exhibits a third solder-resist open (SRO3) that exhibits a third contour with respect to the plane of the first bond pad, wherein the SROn$^{th}$ exhibits a subsequent contact angle with respect to the plane of the first bond pad, where the first contour is flatter than the third contour, and the third contour is flatter than the subsequent contour.

18. The semiconductor device package of claim 14, wherein the third solder-resist layer resists light transmissivity more than the subsequent solder-resist layer;
wherein the third solder-resist layer exhibits a third solder-resist open (SRO3) that exhibits a third contour with respect to the plane of the first bond pad, wherein the SROn$^{th}$ exhibits a subsequent contact angle with respect to the plane of the first bond pad, where the first contour is flatter than the third contour, and the third contour is flatter than the subsequent contour.

19. The semiconductor device package of claim 14, further including:
a first electrical bump disposed in the SRO1 that contacts the first bond pad, wherein the first electrical bump also contacts the first solder-resist layer and the subsequent solder resist layer; and
a semiconductive device in contact with the first electrical bump.

20. The semiconductor device package of claim 14, further including:
a first electrical bump disposed in the SRO1 that contacts the first bond pad, wherein the first electrical bump also contacts the first solder-resist layer and the subsequent solder resist layer;
a semiconductive device in contact with the first electrical bump; and
a board assembled to the semiconductor device package substrate opposite the electrical bump.

21. The semiconductor device package of claim 14, further including:
a first electrical bump disposed in the SRO1 that contacts the first bond pad, wherein the first electrical bump also contacts the first solder-resist layer and the subsequent solder resist layer; a semiconductive device in contact with the first electrical bump, wherein the semiconductive device is part of a chipset; and
a board assembled to the semiconductor device package substrate opposite the electrical bump.

* * * * *